United States Patent
Lee

(10) Patent No.: US 7,553,719 B2
(45) Date of Patent: Jun. 30, 2009

(54) FLASH MEMORY DEVICE AND METHOD FOR FABRICATING THE SAME

(75) Inventor: Sang Bum Lee, Metropolitan (KR)

(73) Assignee: Dongbu Electronics Co., Ltd. (KR)

( * ) Notice: Subject to any disclaimer, the term of this patent is extended or adjusted under 35 U.S.C. 154(b) by 389 days.

(21) Appl. No.: 11/320,677

(22) Filed: Dec. 30, 2005

(65) Prior Publication Data
US 2007/0032019 A1    Feb. 8, 2007

(30) Foreign Application Priority Data
Jul. 26, 2005    (KR) ...................... 10-2005-0067902

(51) Int. Cl.
*H01L 21/8238* (2006.01)
(52) U.S. Cl. .................. 438/201; 438/211; 438/257; 438/593
(58) Field of Classification Search ............... None
See application file for complete search history.

(56) References Cited
U.S. PATENT DOCUMENTS
2005/0098094 A1* 5/2005 Oh et al. .................. 117/95
2006/0043464 A1* 3/2006 Tsunoda et al. ........... 257/316
2007/0052000 A1* 3/2007 Lee ........................... 257/314

* cited by examiner

*Primary Examiner*—David E Graybill
(74) *Attorney, Agent, or Firm*—McKenna Long & Aldridge LLP

(57) ABSTRACT

A flash memory device includes a source region formed in an active region of a semiconductor substrate; a recessed region formed in the active region on either side of the source region, the recessed region including a recess surface having sidewalls; floating gates formed at the sidewalls of the recess surface by interposing a tunnel insulating film; a source line formed on the source region across the active region; and control gate electrodes formed at sidewalls of the source line across a portion of the active region where the floating gates are formed. The floating gates and the control gate electrodes are formed by anisotropically etching a conformal conductive film to have a spacer structure. Cell transistor size can be reduced by forming a deposition gate structure at both sides of the source line, and short channel effects can be minimized by forming the channel between the sidewalls of a recess surface.

5 Claims, 7 Drawing Sheets

SECTION VI-VI'

SECTION VI-VI'

FLASH MEMORY DEVICE AND METHOD FOR FABRICATING THE SAME

CROSS-REFERENCE TO RELATED APPLICATION

This application claims the benefit of Korean Patent Application No. 10-2005-0067902, filed on Jul. 26, 2005, which is hereby incorporated by reference as if fully set forth herein.

BACKGROUND OF THE INVENTION

1. Field of the Invention

The present invention relates to a semiconductor device and more particularly, to a flash memory device and a method for fabricating the same.

2. Discussion of the Related Art

A flash memory device is a nonvolatile memory device. Depending on a cell array configuration, the flash memory device may be formed as a NAND flash device, which requires no contact pattern to connect each cell transistor, or a NOR flash device, which has contact patterns for each cell transistor. NAND flash memory, which uses serially configured cell transistors, i.e., a cell string, provides no random access capability but, without the contact patterns, is more suitable for forming highly integrated (mass storage) devices. By contrast, NOR flash memory enables random access but, due to a contact pattern formation for each cell transistor, is less desirable for embodying highly integrated memory devices.

FIGS. 1A-1C illustrate a conventional flash memory device. FIG. 1B is a cross-sectional view through line B-B of FIG. 1A, and FIG. 1C is a cross-sectional view through line C-C of FIG. 1A. A device isolation film 12 is formed on a semiconductor substrate 10 to define a plurality of active regions. A plurality of floating gates 16 are formed above the active regions by interposing a tunnel insulating film 14. The device isolation film 12 defines a plurality of striped-shaped active regions in the semiconductor substrate 10. The floating gates 16 are arranged on the respective active regions to be spaced apart from one another. A control gate electrode 20 is formed above each floating gate 16 to cross each active region. A gate interlayer dielectric film 18 is interposed between the floating gate 16 and the control gate electrode 20. The floating gate 16 is electrically insulated from the substrate 10 and the control gate electrode 20 by the tunnel insulating film 14 and the gate interlayer dielectric film 18. Source/drain regions 22s and 22d, which include implanted impurities, are formed in the active region at both sides of the floating gate 16. As shown, the flash memory device has a gate structure in which the floating gate 16, the gate interlayer dielectric film 18, and the control gate electrode 20 are sequentially deposited and then commonly patterned together with the tunnel insulating film 14. Spacers 24 are formed at sidewalls of the gate structure during a junction engineering of a peripheral circuit and to electrically isolate the gate structure from a line structure (not shown).

As described above, since the control gate electrode 20 is patterned by a photo-etching process, cell array integration is restricted by the line-width limit (minimum feature size) of a photolithographic process, which may be in the tens of nanometers. Moreover, short channel effects become serious considerations when such narrow line widths are associated with the gate electrode. For these reasons, there are limitations in using photolithography to form the gate structure of the cell transistor of a flash memory device.

SUMMARY OF THE INVENTION

Accordingly, the present invention is directed to a flash memory device and method for fabricating the same that substantially obviates one or more problems due to limitations and disadvantages of the related art.

The present invention is to provide a flash memory device and method for fabricating the same that enable a unit cell size reduction.

Additional advantages, and features of the invention will be set forth in the description which follows and will become apparent to those having ordinary skill in the art upon examination of the following. These and other advantages of the invention may be realized and attained by the structure particularly pointed out in the written description and claims hereof as well as the appended drawings.

To achieve these and other advantages in accordance with the invention, as embodied and broadly described herein, there is provided a flash memory device comprising a source region formed in an active region of a semiconductor substrate; a recessed region formed in the active region on either side of the source region, the recessed region including a recess surface having sidewalls; floating gates formed at the sidewalls of the recess surface by interposing a tunnel insulating film; a source line formed on the source region across the active region; and control gate electrodes formed at sidewalls of the source line across a portion of the active region where the floating gates are formed.

According to another aspect of the present invention, there is provided a method for fabricating a flash memory device, the method comprising defining an active region in a semiconductor substrate; forming a source region in the active region; forming a source line on the source region across the active region; forming a recessed region in the active region by etching the semiconductor substrate at both sidewalls of the source region; forming floating gates at sidewalls of the recessed region by interposing a tunnel insulating film; and forming control gate electrodes across the active region above the floating gates by interposing a gate interlayer dielectric film.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention illustrate exemplary embodiments of the invention and together with the description serve to explain the principle of the invention. In the drawings.

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

Figure 1A:
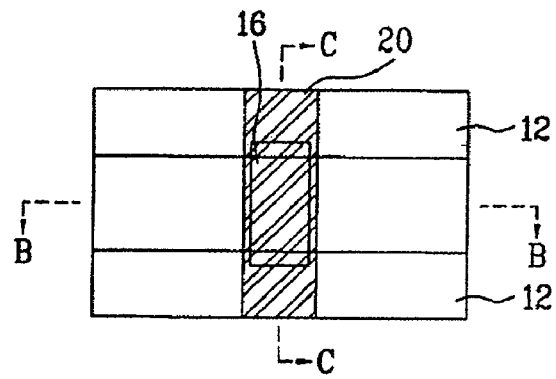
FIG. 1A is a plan view of a contemporary flash memory device.
Figure 1B:
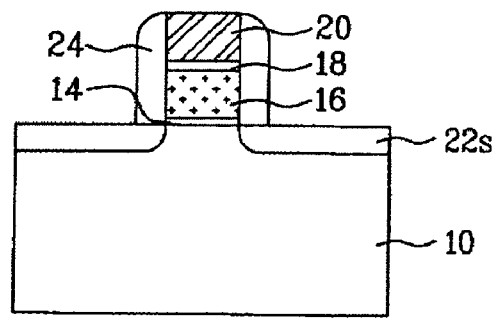
FIGS. 1B and 1C are sectional views along lines B-B and C-C of FIG. 1A, respectively.
Figure 1C:
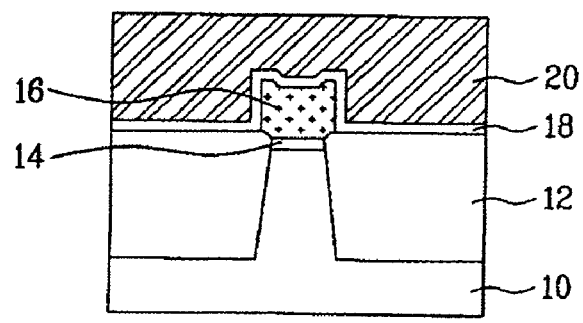
Figure 2A:
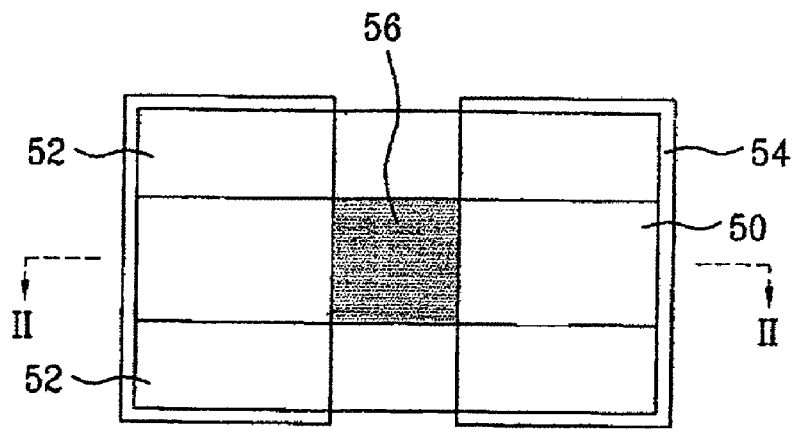
FIG. 2A is a plan view of a flash memory device according to the present invention.
Figure 2B:
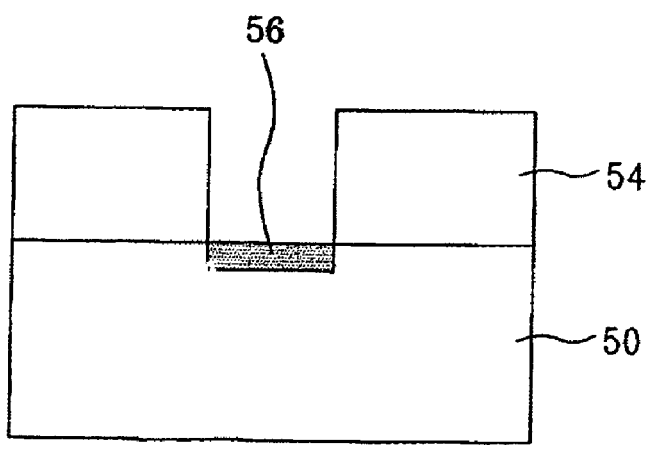
FIG. 2B is a sectional view along line II-II of FIG. 2A.

Referring to FIGS. 2A and 2B, a device isolation film 52 is formed in a surface of a semiconductor substrate 50 to define an active region. A photoresist pattern 54 is formed on the semiconductor substrate 50 as an ion implantation mask exposing a portion of the semiconductor substrate 50 across device isolation film 52 and specifically including the active region to form a source region 56 by implanting impurity ions into the active region.

Figure 3A:
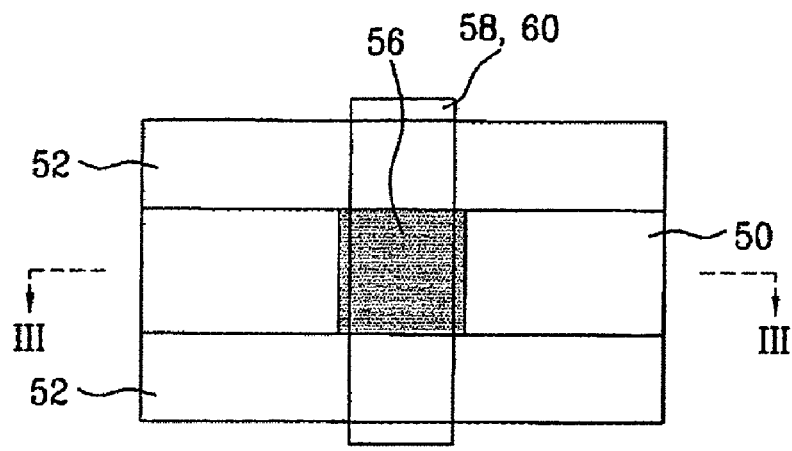
FIG. 3A is a plan view of a flash memory device according to the present invention.
Figure 3B:
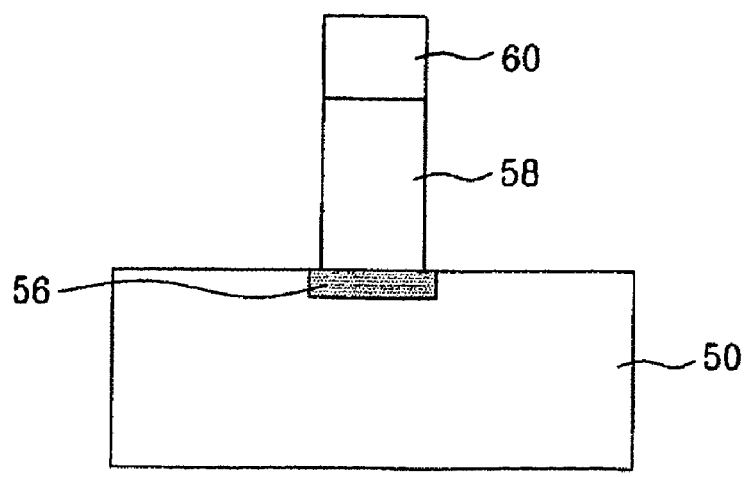
FIG. 3B is a sectional view along line III-III of FIG. 3A.

Referring to FIGS. 3A and 3B, the photoresist pattern 54 is removed, and a conductive film of polysilicon and a capping film are sequentially formed on an entire substrate surface and then commonly patterned to form a source line 58 and a capping pattern 60, respectively, each crossing the active region and the device isolation film 52. The source line 58 has a width smaller than that of the source region 56. Formation of the capping pattern 60 on the source line 58, which is particularly advantageous if the source line is formed with polysilicon, may be a deposition structure including a silicon oxide film and a silicon nitride film.

Figure 4A:
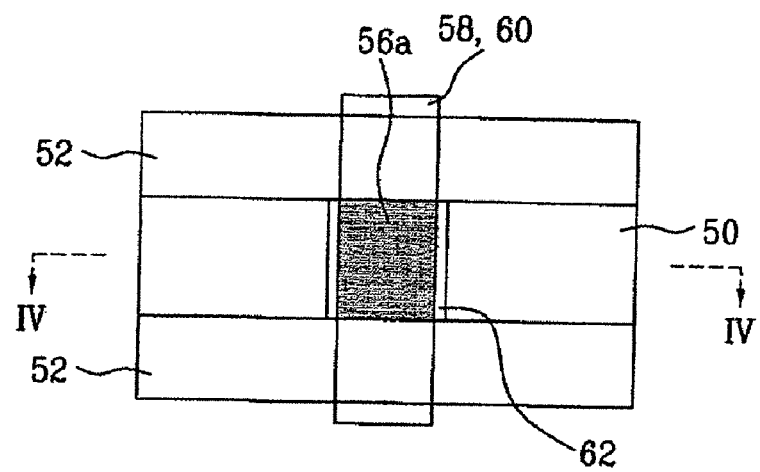
FIG. 4A is a plan view of a flash memory device according to the present invention.
Figure 4B:
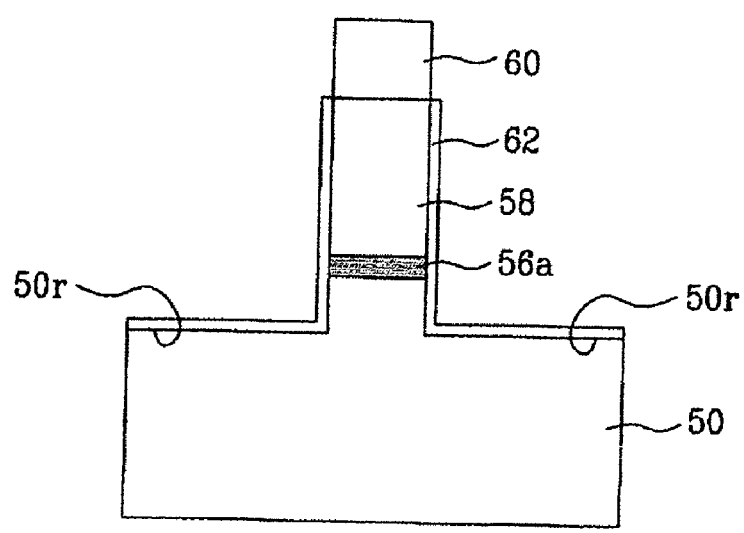
FIG. 4B is a sectional view along line IV-IV of FIG. 4A.

Referring to FIGS. 4A and 4B, the semiconductor substrate 50 is etched using an etching mask formed by the device isolation film 52, together with the structure of the capping pattern 60 and the source line 58, to form a recess surface 50r defining a recessed region. If the source line 58 is formed with polysilicon, the capping pattern 60 serves as a mask that protects the source line 58 when the substrate is etched. Since the width of the source region 56 is smaller than that of the source line 58, formation of the recessed region below the recess surface 50r enables the formation of a self-aligned source region 56a, which is aligned with the narrower source line above. A tunnel insulating film 62, which is typically an oxide film resulting from a thermal oxidization of a substrate surface, is formed on the active regions, and if the source line 58 is formed with polysilicon, the oxidation extends to the sidewalls of the source line 58, as shown, in addition to the surfaces of the recessed region.

Figure 5A:
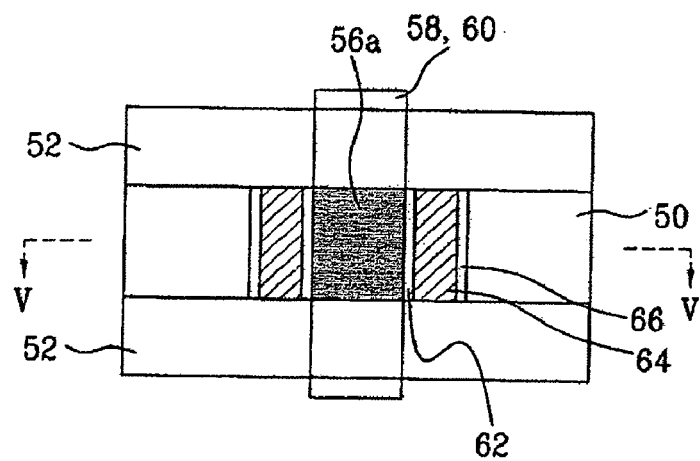
FIG. 5A is a plan view of a flash memory device according to the present invention.
Figure 5B:
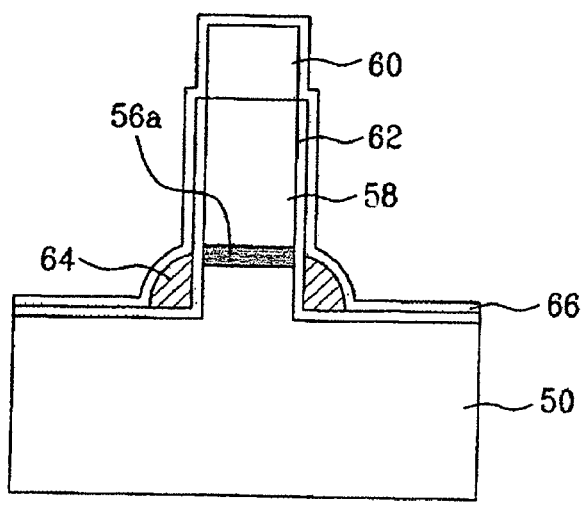
FIG. 5B is a sectional view along line V-V of FIG. 5A.

Referring to FIGS. 5A and 5B, a floating gate conductive film, which may be formed with polysilicon, is formed on the entire substrate surface to conform to the surface and is then anisotropically etched to form floating gates 64 at the sidewalls of the recess surface 50r. Thus, the floating gates 64 are imparted with a spacer structure disposed adjacent either side of the self-aligned source region 56a. A gate interlayer dielectric film 66 is formed on the entire substrate surface to conform to the surface, including the floating gates 64, to thereby be formed over the floating gates. Accordingly, the sidewalls of the source line 58 are provided with a thick insulating film comprised of the tunnel insulating film 62 and the gate interlayer dielectric film 66.

Figure 6A:
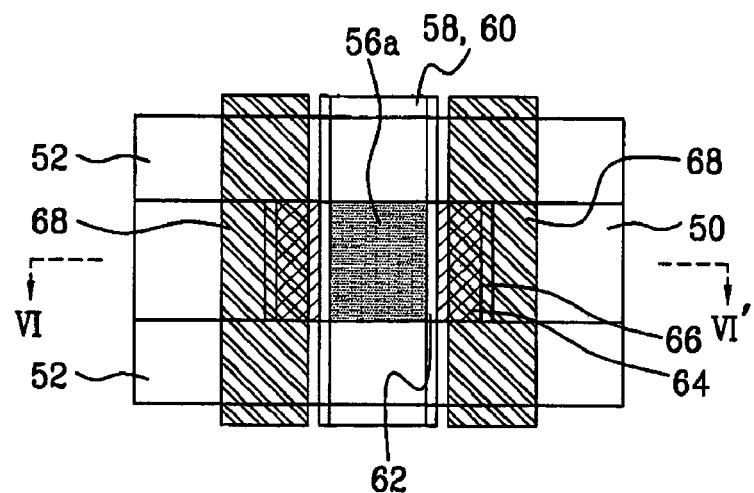
FIG. 6A is a plan view of a flash memory device according to the present invention.
Figure 6B:
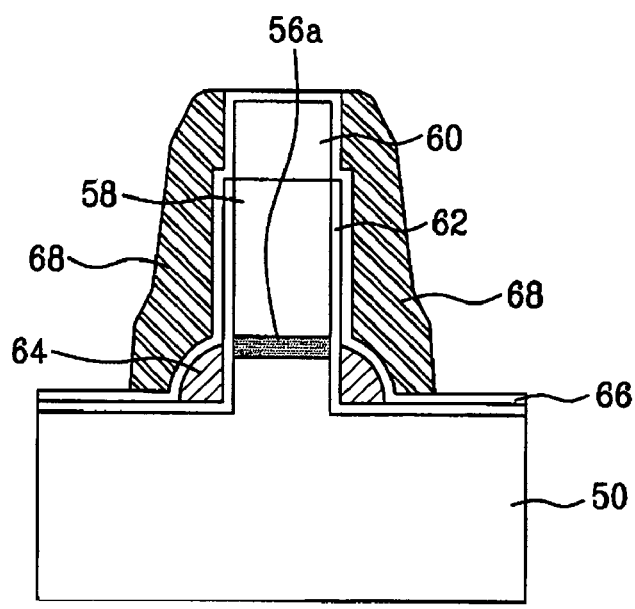
FIG. 6B is a sectional view along line VI-VI of FIG. 6A.

Referring to FIGS. 6A and 6B, a control gate conductive film is formed on the entire substrate surface to conform to the surface and is then anisotropically etched to form control gate electrodes 68 having a spacer structure disposed at the sidewalls of the source line 58. Thus, the control gate electrodes 68 cross the active region and the device isolation film 52, and by interposing the gate interlayer dielectric film 66 between the control gate electrodes and the floating gates 64, are disposed above the floating gates. Alternatively, both the gate interlayer dielectric film 66 and the tunnel insulating film 64, i.e., the aforementioned thick insulating film, may be interposed between the control gate electrodes 68 and the source line 58.

Figure 7A:
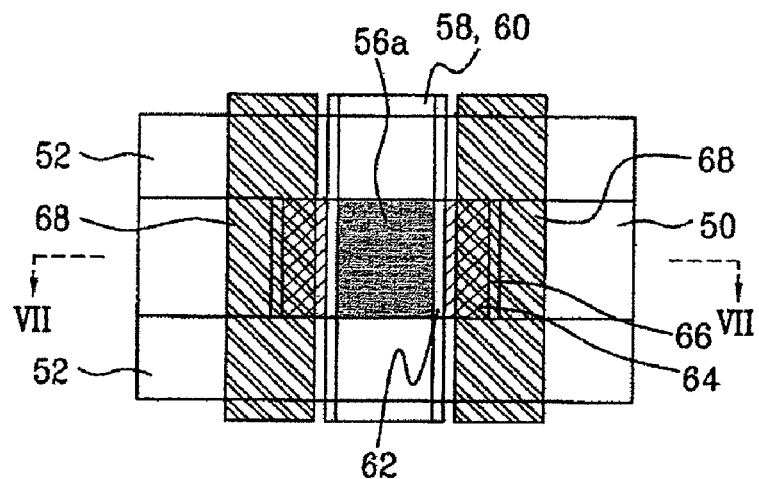
FIG. 7A is a plan view of a flash memory device according to the present invention.
Figure 7B:
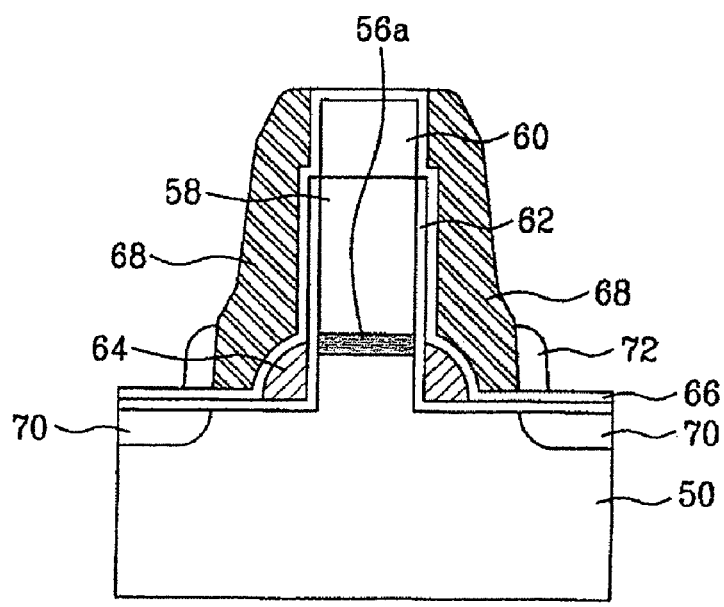
FIG. 7B is a sectional view along line VII-VII of FIG. 7A.

Referring to FIGS. 7A and 7B, a drain region 70 is formed by implanting impurity ions into the active region using the control gate electrodes 68 as an ion implantation mask, such that the drain region is aligned with the control gate electrodes. Then, a metal line (not shown), such as a bit line, is typically formed to be electrically connected to the drain region 70. A silicide layer (not shown) may be additionally provided on upper surfaces of the control gate electrodes 68 and drain region 70.

Accordingly, a flash memory device according to the present invention is shown in FIGS. 7A and 7B. As shown, an active region is defined by formation of the device isolation film 52 in a surface of the semiconductor substrate 50. The source line 58 is formed across the active region and the device isolation film 52, and the source region 56a is formed in the active region below the source line and is self-aligned with respect to the source line such that its sidewalls are aligned with the source line sidewalls. If formed with polysilicon, the source line 58 is capped with the capping insulating film 60. The recessed region is formed in the active region at both sides of the source region 50 by forming the recess surface 50r to be lower than the source region 56a. The tunnel insulating film 62 is formed on the recess surface 50r, that is, on the active region constituting the recessed region, and the floating gates 64 are formed on the tunneling oxide film at a lower portion of the sidewalls of the recess surface, immediately adjacent and on either side of the source region 56a. The tunnel insulating film 62 may extend beyond the sidewalls of the recess surface 50r to the sidewalls of the source line 58 of polysilicon. The gate interlayer dielectric film 66 covers the floating gates 64 and the source line 58, and if present, the capping insulating film 60 as well. The control gate electrodes 68 are formed on the gate interlayer dielectric film 66 across the active region against either sidewall of the source line 58 to be insulated from the floating gates 64 by the gate interlayer dielectric film 66. Therefore, the gate interlayer dielectric film 66 is interposed between the floating gates 64 and the control gate electrodes 68. By contrast, a thick insulating film comprised of the tunnel insulating film 62 and the gate interlayer dielectric film 66 is interposed between the control gate electrodes 68 and the source line 58. The drain region 70 is formed in the active region and its formation may extend under the control gate electrodes 68 to be juxtaposed to the floating gates 64. Spacers 72 may be formed at the sidewalls of the control gate electrodes 68.

In the flash memory device according to the present invention, the floating gates 64 have a spacer structure and are formed at the sidewalls of the recessed region so that the channel of a cell transistor exists in the recessed region between the sidewalls of the recessed surface 50r. Therefore, sufficient channel length can be realized irrespective of the width of the floating gates 64, that is, the anisotropically etched spacer structures of the floating gates 64 and the control gate electrode 68 enable widths smaller than are obtainable under the latest photolithography limitations.

According to the flash memory device and the method for fabricating the same for the present invention, since the deposition gate structure having a width smaller than a minimum line width is formed at both sides of the source line using a photolithographic process, it is possible to form a cell transistor having a symmetrical structure at both sides of the source line. In addition, since the floating gates and the control gate electrodes are formed using a spacer formation process, rather than a photolithographic process, the gate line structure can be formed with a line width smaller than a limit value (minimum feature size) defined by the photolithographic process. Moreover, since the source region and the drain region are formed at different levels of the active region and since the floating gates are formed against a lower portion of the sidewalls and the recessed surface 50r, the channel length of a cell transistor can be increased, without being restricted to the width of the floating gate. Therefore, short channel effects can be reduced by increasing the depth of the recess region, even if the line width of the floating gate is smaller than the photolithography-defined limit.

It will be apparent to those skilled in the art that various modifications can be made in the present invention without departing from the spirit or scope of the invention. Thus, it is intended that the present invention covers such modifications provided they come within the scope of the appended claims and their equivalents.

What is claimed is:

1. A method for fabricating a flash memory device, comprising:

defining an active region in a semiconductor substrate;

forming a source region in the active region;

forming a source line on the source region across the active region;

forming a recessed region in the active region by etching the semiconductor substrate at both sidewalls of the source region;

forming floating gates at sidewalls of the recessed region by interposing a tunnel insulating film; and forming control gate electrodes across the active region above the floating gates by interposing a gate interlayer dielectric film.

2. The method as claimed in claim 1, wherein the source line is formed with a width smaller than the source region.

3. The method as claimed in claim 1, said floating gate forming comprising:

forming the tunnel insulating film at the sidewalls of the recessed region and the sidewalls of the source line;

forming a floating gate conductive film on an entire substrate surface, conforming to the entire substrate; and anisotropically etching the floating gate conductive film.

4. The method as claimed in claim 1, said control gate forming comprising:

forming a gate interlayer dielectric film on an entire substrate surface, conforming to the entire substrate;

forming a control gate conductive film on the gate interlayer dielectric film, conforming to the entire substrate; and anisotropically etching the control gate conductive film.

5. The method as claimed in claim 1, further comprising:

forming a drain region aligned with the control gate electrodes by implanting impurity ions to the active region.

* * * * *